United States Patent [19]

Ulmer

[11] 4,191,898

[45] Mar. 4, 1980

[54] HIGH VOLTAGE CMOS CIRCUIT

[75] Inventor: Richard W. Ulmer, Austin, Tex.

[73] Assignee: Motorola, Inc., Schaumburg, Ill.

[21] Appl. No.: 902,012

[22] Filed: May 1, 1978

[51] Int. Cl.² .............. H03K 17/60; H03K 17/04; H03K 19/08; H03K 19/20

[52] U.S. Cl. .................. 307/264; 307/205; 307/215; 307/270; 307/304; 307/DIG. 1

[58] Field of Search ............ 307/205, 214, 215, 264, 307/270, 304, DIG. 1, 213, 279

[56] References Cited

U.S. PATENT DOCUMENTS

| | | | |
|---|---|---|---|
| 3,436,621 | 4/1969 | Crawford | 357/41 |
| 3,825,772 | 7/1974 | Ainsworth | 307/205 X |
| 3,867,646 | 2/1975 | McCoy | 307/DIG. 1 X |
| 3,900,746 | 8/1975 | Kraft et al. | 307/DIG. 1 X |
| 3,916,430 | 10/1975 | Heuner et al. | 307/DIG. 1 X |
| 3,980,896 | 9/1976 | Kato | 307/205 |
| 3,991,326 | 11/1976 | Kawagoe et al. | 307/270 |
| 4,006,491 | 2/1977 | Alaspa et al. | 307/DIG. 1 X |
| 4,023,050 | 5/1977 | Fox et al. | 307/DIG. 1 X |
| 4,039,862 | 8/1977 | Dingwall et al. | 307/DIG. 1 X |
| 4,069,430 | 1/1978 | Masuda | 307/270 |

Primary Examiner—Larry N. Anagnos
Attorney, Agent, or Firm—Lowell E. Clark

[57] ABSTRACT

A CMOS circuit having high voltage capability is provided. At least one P channel transistor is coupled between a first voltage node and an output of the circuit. At least two N channel transistors are coupled in series between the output of the circuit and a second voltage node. The at least two N channel transistors each have a separate tub which is connected to the source of each respective N channel transistor. This arrangement of the N channel transistors provides at least one tub which is isolated from the voltage nodes when the output of the circuit is at a potential substantially equal to a voltage present at the first voltage node.

6 Claims, 6 Drawing Figures

HIGH VOLTAGE CMOS CIRCUIT

BACKGROUND OF THE INVENTION

This invention relates, in general, to complementary metal oxide semiconductor (CMOS) circuits and more particularly, to a CMOS circuit having high voltage capability.

A typical CMOS circuit will have an output voltage capability of approximately 30 volts, however many CMOS circuits have been known to break down at approximately 18 volts. Occasionally the situation arises where it would be desirable to operate CMOS circuits at voltages higher than the typical breakdown voltages. One application where such high voltage CMOS circuits would be desirable is for driving a multiplex vacuum fluorescent display. Generally speaking, the breakdown voltage of a CMOS circuit is a function of the resistivity of its P tub and also a function of the depth of the N type drain portion of the CMOS circuit. Accordingly, when it is desired to increase the breakdown voltage of the circuit the obvious approach is to vary the resistivity of the P tub or change the depth of the N type drain portion or to take both corrective steps. One of the disadvantages with most known ways of increasing the breakdown voltage of a CMOS circuit is that they involve process changes. Semiconductor processes are often considered to be more of an art than a science, and therefore, changes to the process are made reluctantly and only after much experimentation.

Accordingly, it is an object of the present invention to provide a CMOS circuit having high voltage capability which does not require changes to the process.

Another object of the present invention is to increase the breakdown voltage of a CMOS circuit by adding an additional series N channel transistor and connecting the P tubs in a unique manner.

SUMMARY OF THE INVENTION

In carrying out the above and other objects of the invention in one form there is provided an improved CMOS circuit capable of operating at high voltages. The improved CMOS circuit has at least one P channel transistor coupled between a first voltage node and an ouput of the circuit. At least two N channel transistors are coupled in series between the output and a second voltage node. The at least two N channel transistors each have separate tubs which are connected to their respective sources to provide at least one tub which is isolated from the voltage nodes when the output is at a potential substantially equal to a voltage present at the first voltage node.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiment of the invention in one form thereof and such exemplifications are not to be construed as limiting in any manner.

DESCRIPTION OF THE PREFERRED EMBODIMENTS

Figure 1:
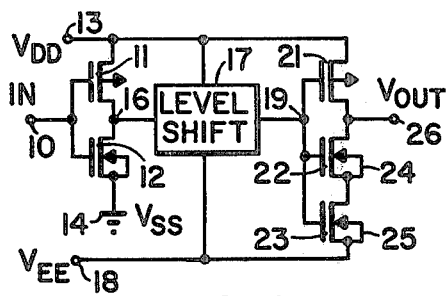
FIG. 1 illustrates an embodiment of the invention in one form thereof.

In FIG. 1, a low voltage input is connected to line 10. What is meant by a low voltage is an input signal normally having a voltage level between $V_{DD}$ and $V_{SS}$. Line 10 is connected to the gate of a P channel transistor 11 and to the gate of an N channel transistor 12. The source of P channel transistor 11 is connected to terminal 13 which is the $V_{DD}$ voltage terminal or node of the circuit. The source electrode of N channel transistor 12 is connected to voltage reference 14, $V_{SS}$. Transistors 11 and 12 from a typical CMOS inverter and provide an output at node 16 which is the inverted input appearing at line 10. The output appearing at node 16 will be a low voltage output. In a typical CMOS circuit, $V_{DD}$ is eighteen volts or less while $V_{SS}$ is ground reference or 0 volts. The output at node 16 will be some voltage level between the values $V_{DD}$ and $V_{SS}$. The input appearing at line 10 will also be within the same voltage range.

Output node 16 is connected to level shift circuit 17. Level shift 17 is connected to $V_{DD}$ terminal 13 and to $V_{EE}$ terminal 18. Level shift 17 takes the low voltage from output node 16 and converts it to a level between $V_{DD}$ and $V_{EE}$. The output of level shift 17 appears on line 19 which is connected to the gate electrode of P channel transistor 21 and to the gate electrodes of N channel transistors 22 and 23. P channel transistor 21 is connected between $V_{DD}$ terminal 13 and output line 26. N channel transistors 22 and 23 are connected in series between output line 26 and $V_{EE}$ terminal 18. Transistors 21, 22, and 23 form a high voltage inverter, and transistor 21 serves as a load means for the high voltage inverter. In a CMOS circuit the load means could be an element other than a P channel transistor, e.g. a P-resistor, polysilicon resistor, etc. The output inverter formed by transistor 21, 22, and 23, in accordance with the present invention, performs functionally the same as the prior art inverter formed by transistors 11 and 12. Voltage $V_{EE}$ is usually a negative voltage with respect to voltage $V_{DD}$ and can be any voltage level so long as the potential between $V_{DD}$ and $V_{EE}$ does not exceed thirty-five volts. If higher voltage operation is desired then additional N channel transistors will have to be placed in series with transistors 22 and 23. The series arrangement of transistors 22 and 23 will provide a typical breakdwon voltage of approximately sixty volts with a minimum breakdown of approximately thirty-five volts. Typical gate rupture voltage for CMOS transistors is approximately eighty volts, and thus does not present a problem for the voltage ranges used as examples herein. The gate rupture voltage can be increased by increasing the gate oxide thickness.

N channel transistors 22 and 23 each have separate P tubs 24 and 25 and each tub 24, 25 is connected to the source of its associated transistor. When the voltage on line 19 exceeds the threshold of transistor 21 then transistor 21 is enabled and N channel transistors 22 and 23 will be disabled or nonconducting and the voltage, $V_{OUT}$, appearing on output line 26 will be substantially the voltage $V_{DD}$. In such a situation, note that the tub of transistor 22 is essentially isolated from the voltage terminals 13 and 18 and increases the breakdown voltage between output line 26 and voltage node 18. When N channel transistors 22 and 23 are nonconducting, and transistor 21 is conducting, the greatest voltage potential will exist between output 26 and $V_{EE}$ terminal 18, assuming that the voltage at $V_{EE}$ is much greater in absolute magnitude than the voltage at $V_{DD}$. N channel transistor 22, with floating tub 24, increases the breakdown voltage of composite transistors 22 and 23. The drain-to-tub breakdown voltage of a typical P channel transistor is approximately 150 volts already and therefore P channel transistor 21 does not suffer from the low breakdown voltage as do the N channel transistors. However, it should be noted that due to different processes, or even variations within the same process, that the drain to source spacing of the P channel transistor may have to be increased slightly to raise its punch through voltage so that punch through does not occur in the P channel transistor in a high voltage CMOS circuit.

Figure 2:
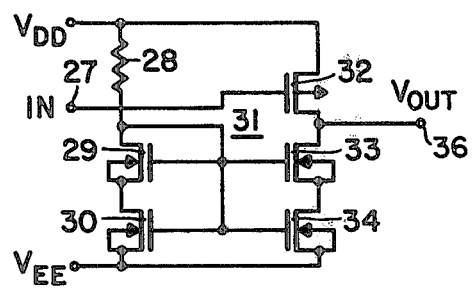
FIG. 2 illustrates in schematic form a voltage level shifter using the invention.

FIG. 2 illustrates a level shift circuit 31 of the type that could be used for level shift circuit 17 of FIG. 1. In FIG. 2 the low voltage input appears at input terminal 27 which is connected to the gate electrode of P channel transistor 32. P channel transistor 32 is connected between voltage terminal $V_{DD}$ and output line 36. A P-resistor 28 is in series with N channel transistors 29 and 30 which cooperate to provide a bias voltage for N channel transistors 33 and 34. The gate of transistor 29 is connected to the drain of transistor 29 to perform a function similar to a diode. N channel transistors 29 and 30 each have individual tubs and form a composite transistor arrangement for handling high voltages. The gate electrodes of transistors 29 and 30 are connected together.

N channel transistors 33 and 34 are in series between output 36 and voltage terminal $V_{EE}$. These N channel transistors also have separate tubs which are connected to the sources of their respective transistors to provide a composite high voltage handling capability. The gate electrodes of transistors 33 and 34 are connected to the gate electrodes of transistor 29 and 30. Transistors 29 and 30, in conjunction with resistor 28, form a bias voltage for transistors 33 and 34. Transistors 33 and 34 act like a current sink. The P-resistor 28 sets the current through composite N channel transistors 29 and 30. The gate-drain voltage of these transistors stabilizes to a voltage set by the current. When transistors 29 and 30 are conducting, the majority of the voltage drop between terminals $V_{DD}$ and $V_{EE}$ will appear across resistor 28. If the current tends to decrease then more voltage will be applied to the gate electrodes of transistors 29 and 30 and these transistors will start to conduct more which in turn increases the voltage drop across resistor 28 thereby stabilizing the bias circuit. The voltage appearing at the gate electrodes of transistors 29 and 30 is also applied to the gates of transistors 33 and 34 to form a current mirror thereby establishing the amount of current the current sink (transistors 33 and 34) can handle. It will be understood that the single bias voltage source illustrated could power other output current sinks simply by connecting the gate electrodes of transistors 29 and 30 to duplicate circuits such as formed by transistors 32, 33, and 34. P channel transistor 32 is large enough to not only pull up the output node to voltage $V_{DD}$ when input 27 enables transistor 32 but also supplies enough current for the current sink formed by transistors 33 and 34. In summary, level shift circuit 31 is capable of taking a low voltage input applied to input 27 and providing a high voltage output on line 36. A high voltage output as used herein, means an output signal having an amplitude between $V_{DD}$ and $V_{EE}$.

Figure 3:
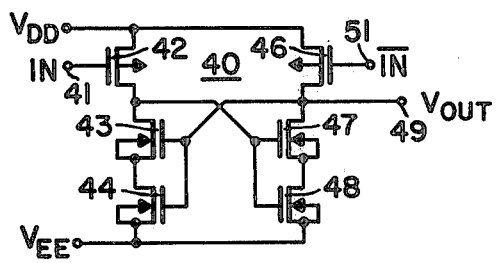
FIG. 3 illustrates a schematic of another level shifter also using the invention in one form.

FIG. 3 shows another level shift circuit capable of shifting a low voltage at its input to a high voltage at its output. Level shift circuit 40 receives an input at input terminal 41 and a complement of the input on input terminal 51. Input 41 is connected to the gate electrode of a P channel transistor 42 which has its source connected to terminal $V_{DD}$ and its drain connected to the drain of an N channel transistor 43. N channel 43 is connected to N channel 44 to form a composite N channel high voltage transistor. The gate electrodes of transistors 43 and 44 are connected to output terminal 49. The source of N channel transistor 44 is connected to voltage terminal $V_{EE}$. N channel transistors 47 and 48 form the composite high voltage transistors coupled between output 49 and voltage terminal $V_{EE}$. The gate electrodes of N channel transistors 47 and 48 are connected to the drain of P channel transistor 42. The input complement connected to input terminal 51 is connected to the gate electrode of P channel transistor 46 which is connected between voltage terminal $V_{DD}$ and output terminal 49. When an input on input terminal 41 enables transistor 42, transistor 46 is disabled since the complement of the enabling signal is applied to its gate electrode by input terminal 51. With transistor 46 enabled, voltage $V_{DD}$ is applied to the gates of transistors 47 and 48 which enable these transistors thereby applying voltage $V_{EE}$ to output 49. The voltage $V_{EE}$ at output 49 is coupled to the gate electrodes of transistors 43 and 44 which hold these transistors in a nonconducting state. When the input to terminal 41 is switched, then of course transistor 42 ceases to conduct and transistor 46 commences conducting and causes the output at terminal 49 to approach voltage $V_{DD}$. The four N channel transistors 43, 44, 47 and 48 all have separate P tubs which are connected to their respective sources.

Figure 4:
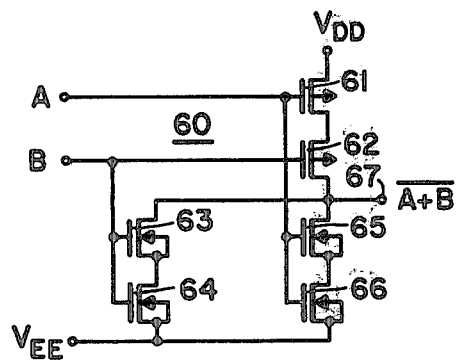
FIG. 4 illustrates in schematic form a logic gate using the invention.

FIG. 4 illustrates a logic NOR gate 60 embodying the present invention. Two series connected P channel transistors 61 and 62 are between voltage terminal $V_{DD}$ and node 67. Two N channel composite transistors 65 and 66 are coupled between node 67 and voltage terminal $V_{EE}$. The gate electrodes of transistors 65 and 66 are connected to the gate electrode of transistor 61 which is also connected to input A. A second pair of composite N channel transistors 63 and 64 are in parallel with transistors 65 and 66. N channel transistors 63 and 64 have their gate electrodes connected to the gate electrode of transistor 62 which is also connected to input B. Output node 67 is connected to output $\overline{A+B}$. It will be noted that logic gate 60 is similar to a typical prior art CMOS logic gate with the addition of composite N channel transistors to increase the breakdown voltage of the CMOS logic gate. Each of the CMOS transistors has an independent tub which is connected to the respective source of the transistor.

FIG. 4 illustrates the use of the present invention in a typical 2-input CMOS logic NOR gate and it will be understood that if a logic gate with more inputs is desired, then additional composite N channel transistors can be added to provide the necessary high voltage capability.

Figure 5:
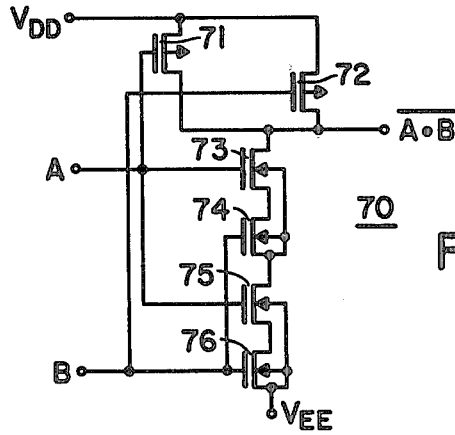
FIG. 5 illustrates in schematic form another logic gate using the invention.

FIG. 5 is an example of the present invention being used in a 2-input CMOS NAND gate 70. NAND gate 70 has input A and B and output $\overline{A \cdot B}$. Two P channel transistors 71 and 72 are in parallel between voltage terminal $V_{DD}$ and output $\overline{A \cdot B}$. Four N channel transistors 73, 74, 75, and 76 are connected in series between output $\overline{A \cdot B}$ and voltage terminal $V_{EE}$. The gate electrodes of transistors 73 and 75 are connected to input A and to the gate electrode of transistor 71. The gate electrodes of transistors 74 and 76 are connected to input B and to the gate electrode of transistor 72. This is a standard CMOS NAND gate configuration with the addition of the present invention, and it will be understood that if more inputs are required, the high voltage handling capability would be implemented in the same manner as illustrated.

Each of the N channel transistors 73 through 76 can have its own individual P tub, however, transistors 73 and 74 can be in the same P tub and transistors 75 and 76 can be in a separate P tub. The inportant point is that one tub be isolated from $V_{EE}$ and the output of the circuit. In the case where each of transistors 73 through 76 are in separate tubs, the tub of transistor 73 is connected to the tub of transistor 74, and the tub of transistor 74 is connected to its source; the tubs of transistors 75 and 76 are connected together and then to the source of transistor 76. The important point is that the arrangement provide at least one tub which is isolated from voltage terminals $V_{DD}$ or $V_{EE}$ when either P channel transistor 71 or 72 is conducting.

Figure 6:
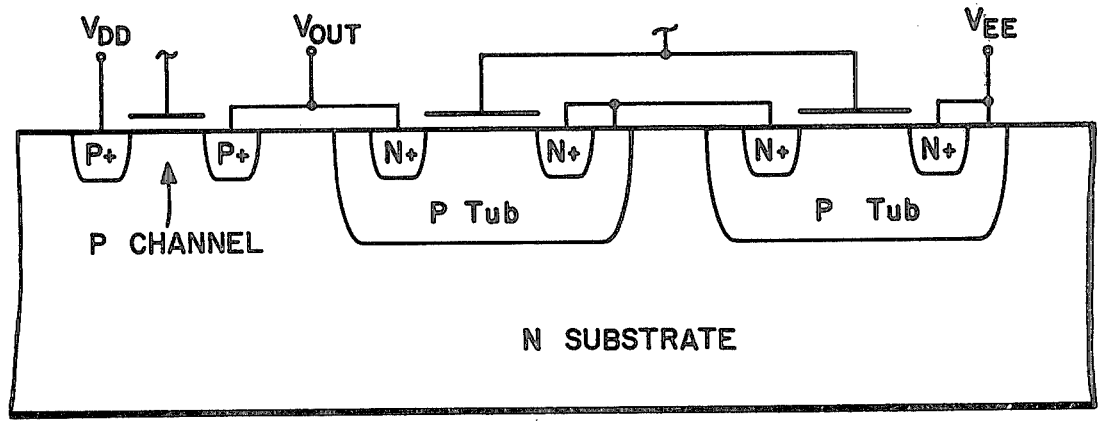
FIG. 6 is a pictorial representation of a cross-section of a piece of silicon to illustrate the connection to the P tubs.

A pictorial representation of a cross-sectional view of a portion of a semiconductor chip is illustrated in FIG. 6 having two N channel transistors in series between $V_{OUT}$ and $V_{EE}$. An N type substrate is shown having a P channel field effect transistor and two series connected N channel field effect transistors. The source of the P channel transistor is connected to voltage $V_{DD}$. The drain of the P channel transistor is connected to $V_{OUT}$ and to the drain of one of the N channel transistors. The gates of the two N channel transistors are connected together. The source of each of the N channel transistors is connected to the P tub of each respective transistor. The source and P tub of one of the N channel transistors is connected to voltage $V_{EE}$.

By now it should be appreciated that there has been provided a high voltage CMOS circuit which does not require changes to the semiconductor process. This high voltage CMOS circuit is readily integrated into a single chip.

Consequently, while in accordance with the Patent Statutes, there has been described what at present is considered to be the preferred forms of the invention, it will be obvious to those skilled in the art that numerous changes and modifications may be made herein without departing from the spirit and scope of the invention, and it is therefore aimed that the following claims cover all such modifications.

What is claimed as new and desired to be secured by Letters Patent of the United States is:

1. A CMOS monolithic integrated circuit having high voltage capability, comprising: a P channel field effect transistor having a first electrode, a second electrode and a gate electrode, the first electrode capable of being coupled to a first voltage potential; a first N channel field effect transistor having a first and a second electrode and a gate electrode, the first electrode of the first N channel transistor being coupled to the second electrode of the P channel transistor and forming an output junction for the circuit; a second N channel field effect transistor having a first and a second electrode and a gate electrode, the first electrode of the second N channel transistor being coupled to the second electrode of the first N channel transistor, the second electrode of the second N channel transistor being capable of being coupled to a second voltage potential, each of said first and second N channel field effect transistors having a tub and wherein each tub is connected to the second electrode of each respective transistor, and the gate electrodes of the P channel and first and second N channel transistors all being coupled together; and a level shift means for providing a voltage level shift to an input voltage, the level shift means providing an output coupled to the gate electrodes of the P channel and first and second N channel transistors.

2. A CMOS monolithic integrated inverter circuit having high voltage capability, comprising: a P channel transistor; and a first and second N channel transistor, the P channel and the first and second N channel transistors all being coupled in series and all the transistors having gate electrodes connected together and forming an input for the inverter circuit, an output for the circuit comprising the connection between the P channel transistor and the first N channel transistor, the first and second N channel transistors each having a separate P tub.

3. A CMOS circuit having high voltage capability and being able to provide a voltage level shift, comprising: a first N channel transistor having a first and a second electrode and a gate electrode, the gate electrode being coupled to the first electrode; a second N channel transistor having a first and a second electrode and a gate electrode, the first electrode of the second N channel transistor being coupled to the second electrode of the first N channel transistor, the second electrode of the second N channel transistor being connectable to a first voltage potential terminal, the gate electrode of the second N channel transistor being coupled to the gate electrode of the first transistor; means for providing a resistance coupled between the first electrode of the first N channel transistor and a second voltage potential terminal; a P channel transistor coupled between the second voltage potential and an output node and having a gate electrode for receiving an input to the circuit; a third N channel transistor having a first and a second electrode and a gate electrode, the first electrode of the third N channel transistor being coupled to the output node, the gate electrode of the third N channel transistor being coupled to the gate electrode of the first N channel transistor; and a fourth N channel transistor having a first and a second electrode and a gate electrode, the first electrode of the fourth N channel transistor being coupled to the second electrode of the third N channel transistor, the second electrode of the fourth N channel transistor being coupled to the first voltage potential terminal, each of the N channel transistors having a separate tub and each tub being connected to a respective second electrode.

4. A CMOS circuit having high voltage capability and providing a voltage level shift between an input and an output of the circuit comprising: a first P channel transistor coupled between a first voltage potential terminal and a first node and having a gate electrode coupled to the input of the circuit; a first and a second N channel transistor coupled in series between the first node and a second voltage potential terminal and having gate electrodes coupled to the output of the circuit; a second P channel transistor coupled between the first voltage potential terminal and the output and having a gate electrode for receiving a complement of a signal receivable by the input of the circuit; and a third and fourth N channel transistor coupled in series between the output and the second voltage potential terminal and having gate electrodes coupled to the first node, each N channel transistor having a separate tub which is connected to a source of its respective transistor.

5. A CMOS circuit having high voltage capability and capable of performing a logic gate function and having at least a first and a second input and an output, comprising: a first and a second P channel transistor coupled in series between a first voltage potential node and the output, each P channel transistor having a gate electrode serving as an input for the circuit; a first and second N channel transistor coupled in series between the output and a second voltage potential node and having gate electrodes coupled to the first input of the circuit; and a third and fourth N channel transistor coupled in series between the output and the second voltage potential node and having gate electrodes coupled to the second input of the circuit, each of the N channel transistors having a separate tub connected to a source of the respective N channel transistor.

6. A CMOS circuit having high voltage capability and having at least a first and a second input and an output and being capable of performing a logic gate function, comprising: a first and a second P channel transistor coupled in parallel between a first voltage node and the output, the first P channel transistor having a gate electrode coupled to the first input and the second P channel transistor having a gate electrode coupled to the second input; a first and a second N channel transistor connected in series and coupled to the output, the first N channel transistor having a gate electrode coupled to the first input and the second N channel transistor having a gate electrode coupled to the second input; and a third and a fourth N channel transistor coupled in series between a second voltage node and the first and second N channel transistors, the third N channel transistor having a gate electrode coupled to the first input and the fourth N channel transistor having a gate electrode coupled to the second input, each of the N channel transistors having a separate tub, the tubs of the first and second N channel transistors being connected to the source of the second N channel transistor, the tubs of the third and fourth transistors being coupled to the second voltage node to provide at least two N channel transistors in series in a nonconducting state when the output is at a potential substantially equal to a voltage present at the first voltage node.

* * * * *